United States Patent [19]
Fujimoto

[11] Patent Number: 6,107,837
[45] Date of Patent: Aug. 22, 2000

[54] ADDRESS DECODING CIRCUIT

[75] Inventor: Yukihiro Fujimoto, Kanagawa-ken, Japan

[73] Assignee: Kabushiki Kaisha Toshiba, Kawasaki, Japan

[21] Appl. No.: 09/102,895

[22] Filed: Jun. 23, 1998

[30] Foreign Application Priority Data

Jun. 23, 1997 [JP] Japan ..................................... 9-166216

[51] Int. Cl.$^7$ ..................................................... G11C 8/00
[52] U.S. Cl. ........................................... 326/105; 326/106
[58] Field of Search ................................... 326/105, 106, 326/108, 122, 119, 121

[56] References Cited

U.S. PATENT DOCUMENTS 5,532,971  7/1996  Tanaka et al. ...................... 365/230.06

Primary Examiner—Michael Tokar
Assistant Examiner—Anh Tran
Attorney, Agent, or Firm—Foley & Lardner

[57] ABSTRACT

A decoding circuit decodes address signals of 7-bit so as to select one of 128 decoded signals preliminarily set to selective condition and keeps its selective condition. Then the decoding circuit switches the other decoded signals except the selected decoded signal from the selective condition to non-selective condition. A buffer circuit detects that the decoded signals different from the decoded signal kept in the selective condition have been switches from the selective condition to the non-selective condition by receiving the 128 decoded signals from the decoding circuit. Then the buffer circuit selects an output selective signal corresponding to the decoded signal in the selective condition, out of the 128 output selective signals corresponding to the 128 decoded signals, and makes the output selective signal in the selective condition.

8 Claims, 6 Drawing Sheets

ADDRESS DECODING CIRCUIT

BACKGROUND OF THE INVENTION

1. Field of the Invention

The present invention relates to acceleration of an address decoding circuit and is preferably applicable in, particularly, a row decoder of a synchronous type high-speed memory.

2. Description of the Prior Art

In a memory apparatus, a row decoder in an address decoding circuit selects one of plural word lines in its memory array according to inputted address signals so as to activate the corresponding memory cells. Thus, an output of the row decoder determines a timing of activation of the memory cells and affects data reading timing in a sense amplifier. Therefore, the acceleration of the address decoding circuit is very important for the acceleration of the memory access.

FIG. 1 shows a conventional address decoding circuit and FIG. 2 shows operating waveform thereof.

This address decoding circuit decodes 7-bit row address signals so as to select a word line 106 from a memory array 100 having 128 rows. The address decoding circuit comprises a predecoding portion 101, a main decoding portion 102, and a word line buffer portion 103. The predecoding portion 101 divides the address signals by 2 bits, 2 bits and 3 bits thereof to decode by using a logical product (AND) gate and outputs predecoded signals of 4 bits, 4 bits and 8 bits. A predecoded signal corresponding to an address of the word line 106 is inputted into an AND gate 104 provided on each of the word lines 106 in a main decoding portion 102 and a decoding result is outputted from the AND gates 104. By executing the decoding through two stages, the decoding is carried out without using a multi-input CMOS so as to achieve the acceleration.

After decoding, the word line buffer 103 activates the word line 106 selected by the main decoding portion 102 by an input of a clock signal. This word line buffer portion 103 activates the word line 106 synchronously with the clock signal by the AND gate in which a decoding result of the main decoding portion 102 and the clock signal are to be inputted. Further, the word line buffer portion is necessary for not activating the memory cells 107 when bit lines of a cell array 100 are precharged. In the word line buffer portion 103, to prevent an occurrence of glitch in the word line 106, the clock signal input timing always must come after the decoding is completed as shown by the operating waveform of FIG. 2.

In such an address decoding circuit, the activation of the word line 106 must be carried out after selection/non-selection of the decoding output is established. Thus, to reduce the decoding time, it is necessary to accelerate both a rise and fall of the decoding output, so that limiting matter for the acceleration increases.

As a solving measure, there is a way in which a precharge type logic is used in a decoding portion 112 as shown in FIG. 3. Because the precharge type logic produces only data transition in a single direction when data is determined, acceleration by adjustment of the size ratio between the P-type MOSFET (field effect transistor) and N-type MOSFET is effective.

In the circuit structure shown in FIG. 3, by obtaining AND between each of an input address and the complementary address and a first clock signal in the address input portion 111, the address signals are converted to signals synchronous to the first clock signal, and in a decoding portion 112, an address signal corresponding to an address of the word line 116 is inputted to a decoding circuit 114 of each word line 116. A decoding circuit 114 is constituted of N-type MOSFETs 117 of the same number as bit width of the address and a P-type MOSFET 118 for precharging. The source terminals of the N-type MOSFETs 117 are commonly grounded and the drain terminals thereof are commonly connected to an output terminal 119. Each of the clock-synchronous address signals is respectively inputted to each gate terminal depending on address of the word line 116. The source terminal of the P-type MOSFET 118 is connected to a power supply level and the drain terminal thereof is connected to the output terminal 119 so that the output terminal 119 is precharged to high level by a precharging signal supplied to a gate terminal thereof. A word line buffer portion 113 obtains AND between each of outputs of the output lines 119 of the decoding portion 112 and a second clock signal so as to output a signal for selecting a word line 116.

While the P-type MOSFET 118 of the decoding portion 112 is turned on by the precharging signal, address inputs to the decoding portion 112 are all set to low level by the first clock signal of the address input portion 111 and the plural N-type MOSFETs 117 of the decoding portion 112 are all turned off so that the output of the decoding circuit 114 is precharged to high level by the P-type MOSFET 118. At this time, the second clock signal of the word line buffer portion 113 remains low level so that the word lines 116 are not activated. If the P-type MOSFET 118 is turned off by the precharging signal and the first clock signal becomes high level so that the address signals are inputted to the decoding portion 112, at least one of seven N-type MOSFETs 117 of each of 127 decoding circuits 114 except the decoding circuit corresponding to the word line 116 indicated by the address is turned on and then the output signal is switched to low level. At this time, in the word line buffer portion 113 of the next stage, the decoded output remains low level even if the second clock signal is inputted. Thus, the word line 116 is not activated. Only an output of the decoding circuit 114 of the word line 116 indicated by the address signal is maintained at a potential at the time of precharge (high level), so that the word line 116 indicated by the address signal is driven by an input of the second clock signal in the word line buffer portion 113 of the next stage.

Because in this address decoding circuit of precharge type, data transition direction (from high level to low level in an example of FIG. 3) in the decoding portion 112 is constant, the decoding circuit 114 has to be accelerated only in a direction in which the word line 116 is turned into non-selective condition (from high level to low level in the example of FIG. 3). Thus, acceleration of the decoding portion 112 is facilitated and adjustment or the like of the size ratio between the P-type MOSFET 118 and N-type MOSFET 117 of each gate is effective.

However, the input timing of the second clock signal in the word line buffer portion 113 must come after it is detected that the word line(s) 116 to be in the non-selective condition should be in the non-selective condition in the decoding circuit 114. Therefore, the second clock signal input timing must be adjusted so as to be later than the decoded signal output like the above-mentioned conventional example.

If the output of the decoding circuit 114 is later than the second clock signal for activating the word line 116, a glitch occurs in the word line 116 thereby leading to malfunction. Thus, the second clock signal for activating the word line 116 must be provided with a sufficient timing margin thereby leading to extending the decoding time. Further, in this example, in the address input portion 111 as well, AND with the first clock signal is obtained due to necessity of converting the input signals to the address decoding circuit to input signals synchronous to the first clock signal and therefore in this portion as well, timing between the address input and first clock signal needs to have a margin. Therefore, the timing margins of these two places may enlarge the decoding time.

As described above, in a conventional synchronous type address decoding circuit for outputting a signal for selectively activating the word line synchronously with the clock signal, irrespective of the predecoding type or precharging type, the clock signal must be inputted after the decoding result of the address signals is established. Thus, there has been provided a timing margin between the establishment of the decoding result and input of the clock signal. However, if the timing margin is too large, the output of the decoding result is delayed so that the operating speed of the address decoding circuit is lowered. On the other hand, if the timing margin is too quick, a glitch occurs in the word line thereby sometimes leading to malfunction. For the reasons, it has been very difficult to set both timings optimally without being affected by various factors of the circuit relating to signal delay.

SUMMARY OF THE INVENTION

Accordingly, the present invention has been made to solve the above problems, and it is therefore an object of the invention to provide an address decoding circuit capable of optimizing an output timing of a decoding result so as to reduce a decoding time and prevent a malfunction in the decoding operation.

To achieve the above object, there is provided an address decoding circuit of synchronous type for decoding address signals of n-bit so as to select one of $2^n$ output selective signals and make the selected one in selective condition, the address decoding circuit comprising: a decoding circuit for decoding the address signals of n-bit so as to select one of $2^n$ decoded signals preliminarily set to selective condition and keeping its selective condition and then switching the other decoded signals except the selected decoded signal from the selective condition to non-selective condition; and a buffer circuit for detecting that the decoded signals different from the decoded signal kept in the selective condition have been switched from the selective condition to the non-selective condition by receiving the $2^n$ decoded signals from the decoding circuit and then selecting an output selective signal corresponding to the decoded signal in the selective condition, out of the $2^n$ output selective signals corresponding to the $2^n$ decoded signals, and making the output selective signal in the selective condition.

According to a preferred embodiment of the present invention, an address decoding circuit mentioned above is so constructed that the decoding circuit comprises: a predecoding portion for dividing the address signals of n-bit into a predetermined number to decode the divided address signals and outputting its decoding result synchronously with a clock signal as intermediate decoded signals; and a main decoding portion having FETs for precharging $2^n$ output lines for outputting the $2^n$ decoded signals in the selective condition and FETs for discharging output lines corresponding to the intermediate decoded signals supplied from the predecoding portion, and the buffer potion comprises: $2^n$ inverting circuits for inverting an output line of the $2^n$ output lines except a corresponding output line thereof; and $2^n$ gate buffers for obtaining logical product between a corresponding output line signal and an output signal of a corresponding inverting circuit thereof of the $2^n$ inverting circuits to generating the $2^n$ output selective signals.

According to another preferred embodiment of the present invention, an address decoding circuit mentioned above is so constructed that the decoding circuit comprises: an address input portion for receiving the address signals and outputting the address signals and inverted address signals generated by inverting the address signals synchronously with a clock signal; and a decoding portion having FETs for precharging $2^n$ output lines for outputting the $2^n$ decoded signals in the selective condition and FETs for discharging output lines corresponding to the address signals and the inverted address signals supplied from the address input portion, and the buffer potion comprises: $2^n$ inverting circuits for inverting an output line of the $2^n$ output lines except a corresponding output line thereof; and $2^n$ gate buffers for obtaining logical product between a corresponding output line signal and an output signal of a corresponding inverting circuit thereof of the $2^n$ inverting circuits to generating the $2^n$ output selective signals.

According to still another preferred embodiment of the present invention, an address decoding circuit mentioned above is so constructed that each of the $2^n$ inverting circuits inputs an output line whose address is different by one bit from an address of the corresponding output line as the output line except the corresponding output line so as to invert the inputted output line.

According to further preferred embodiment of the present invention, an address decoding circuit mentioned above is so constructed that each of the $2^n$ inverting circuits inputs an output line converted to non-selective condition latest of the $2^n$ output lines except the corresponding output line as the output line except the corresponding output line so as to invert the inputted output line.

The nature, principle and utility of the invention will become more apparent from the following detailed description when read in conjunction with the accompanying drawings.

DESCRIPTION OF THE PREFERRED EMBODIMENTS

Hereinafter, the embodiments of the present invention will be described with reference to the accompanying drawings.

Figure 1:
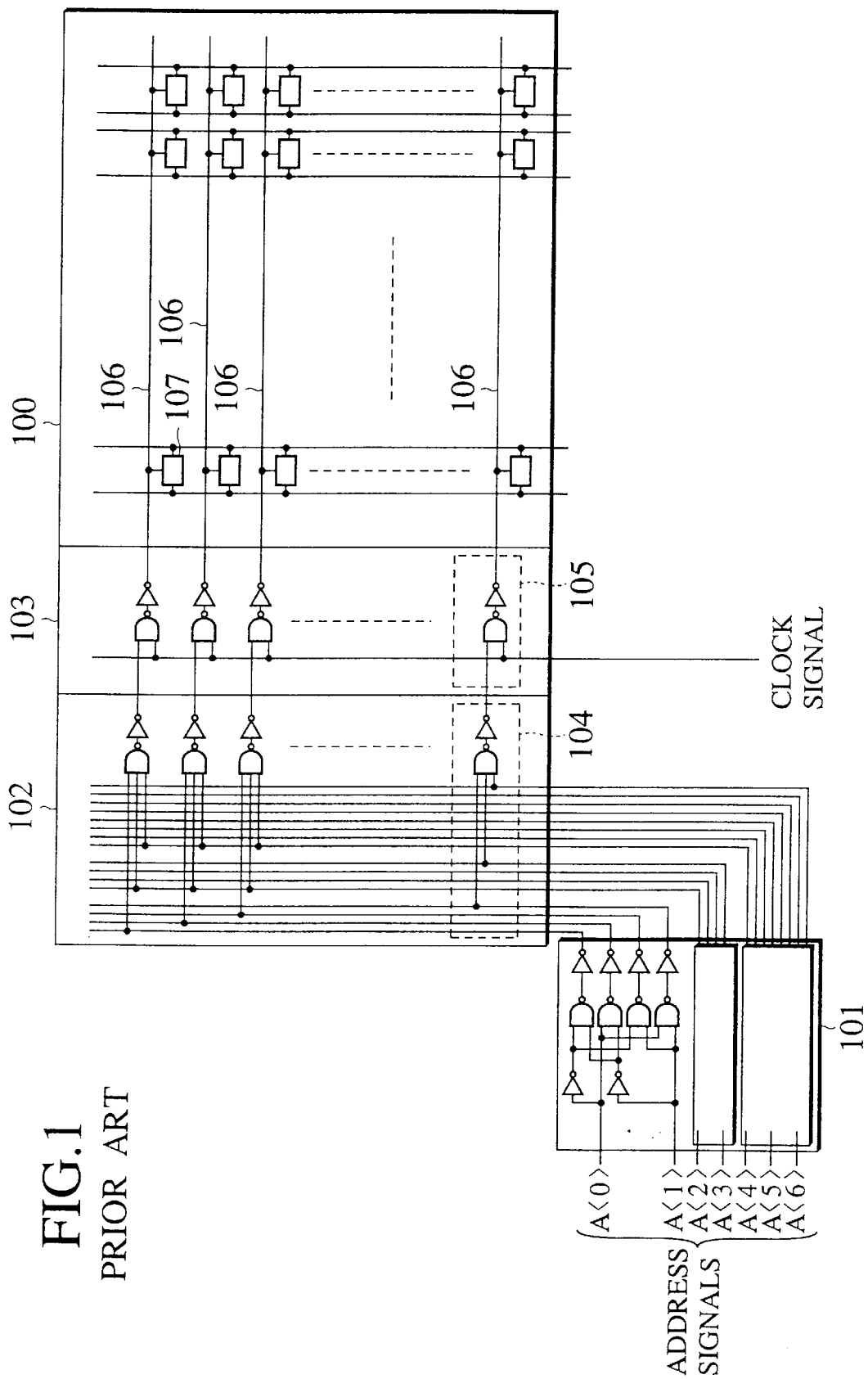
FIG. 1 is a diagram showing a structure of a conventional address decoding circuit.
Figure 2:
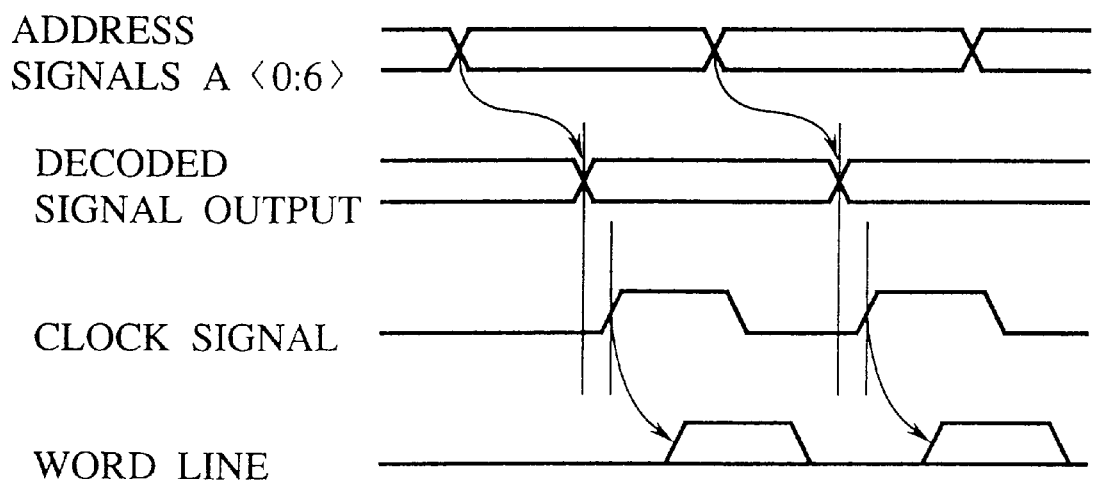
FIG. 2 is a diagram showing an operating waveform of the circuit shown in FIG. 1.
Figure 3:
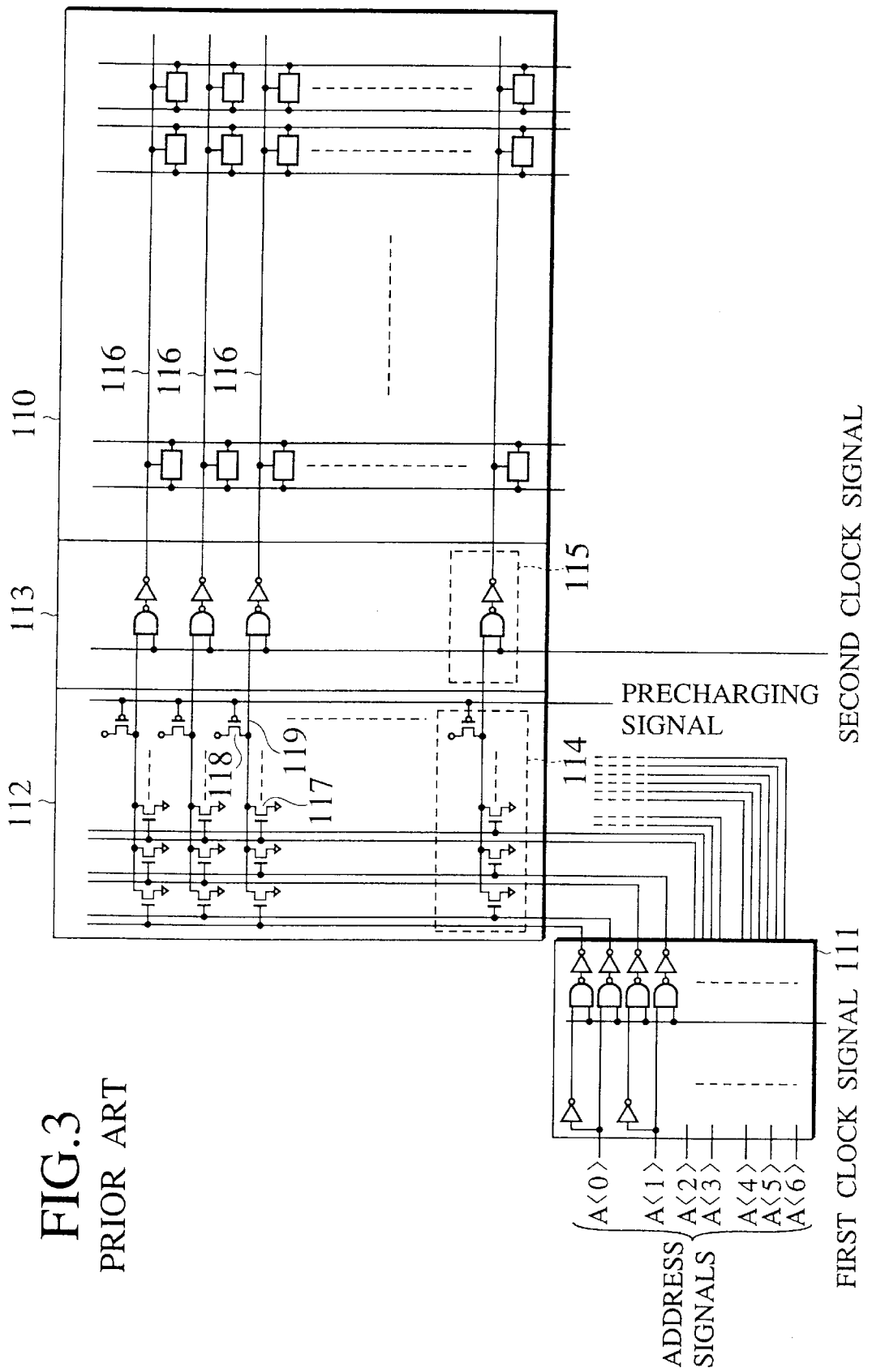
FIG. 3 is a diagram showing another structure of a conventional address decoding circuit.
Figure 4:
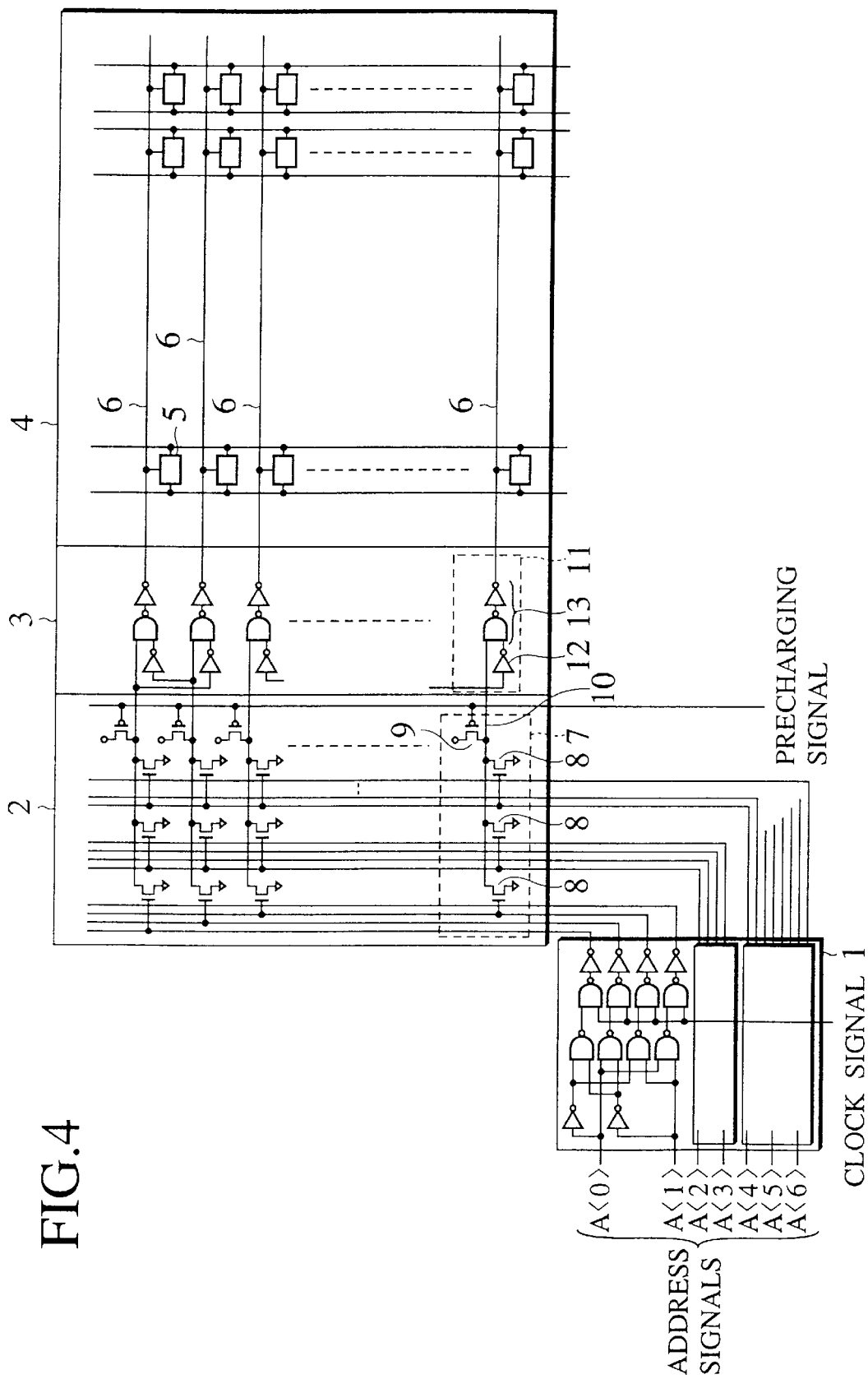
FIG. 4 is a diagram showing a structure of an address decoding circuit according to an embodiment of the present invention.

FIG. 4 is a diagram showing a structure of an address decoding circuit according to an embodiment of the present invention.

Referring to FIG. 4, an address decoding circuit of this embodiment comprises a predecoding portion 1 and a main decoding portion 2, both which are decoding circuits which decode n-bit address signals, for example 7-bit address signals synchronously with a clock signal so as to select one of $2^n$, for example 128 output selective signals for selecting 128 word lines and specifically receives 7-bit address signals to select one decoded signal out of 128 decoded signals preliminarily set in selective condition and hold the selecting condition of the selected decoded signal and to switch the other decoded signals than the selected decoded signal from the selective condition to non-selective condition; and a word line buffer portion 3 which is buffer circuit which receives the 128 decoded signals of the decode circuits to detect that the other decoded signals than the selected decoded signal held in the selective condition have been switched from the selective condition to the non-selective condition and then selectively put an output selective signal corresponding to the selected decoded signal in the selective condition out of 128 output selective signals corresponding to 128 decoded signals.

The predecoding portion 1 divides address signals by 2 bits, 2 bits and 3 bits thereof and obtains a logical product between the predecoding result and a clock signal so as to convert predecoded signals of the predecoding result to signals synchronous to the clock signal. An initial state of the predecoding signals is set in low level by the clock signal irrespective of the address signals, and a decoding result corresponding to the address signals is output when the clock signal is input.

The main decoding portion 2 contains 128 decoding circuits 7 corresponding to 128 word lines 6 for selecting memory cells of each row of a memory array 4. The decoding circuit 7 comprises three N-type MOSFETs 8, three being a number for dividing the address signals to predecode the address signals, and a P-type MOSFET 9 for precharging. The source terminals of the three FETs 8 are commonly grounded and the drain terminals thereof are commonly connected to an output terminal 10. A predecoded signal corresponding to an address of each word line 6 is input to each of the gate terminals of the three FETs 8 so that and wired OR logic is formed with respect to the output terminal 10. The source terminal of the FET 9 is connected to a power supply and the drain terminal thereof is connected to the output terminal 10. By a precharging signal to be applied to the gate terminal, the output terminal 10 in the main decoding portion 2 is precharged.

A word line buffer portion 3 includes 128 buffer circuits 11 which correspond to the word lines 6 and select or not select the corresponding word lines 6. A decoded signal outputted from the output terminal 10 of the decoding circuit 7 corresponding to an address of the word line 6 and a decoded signal of the decoding circuit 7 corresponding to an address which is different from the address of the aforementioned word line 6 by one bit are inputted to the buffer circuit 11. The latter decoded signal is inverted by an inverting gate 12. Then a logical product between the inversion signal and the former decoded signal is obtained by a logical product (AND) gate 13. Its result is supplied to each corresponding word line 6 as an output selective signal for selectively controlling the word line 6.

With this structure, when the FET 9 of the main decoding portion 2 is turned on by the precharging signal and also the clock signal sets all the predecoding outputs to low level at the predecoding portion 1, three FETs 8 of the main decoding portion 2 are all turned off, so that all the decoded signal outputs are fixed to high level. An inversion signal generated by inverting a decoded signal output from a decoding circuit 7 having an address different from that of a word line 6 by one bit by the inverting gate 12 is inputted to the AND gate 13 of the buffer circuit 11. Because this inversion signal gets into low level, the word line 6 is not activated so that it is turned into the non-selective condition.

Next, when the FET 9 is turned off by the precharging signal and the predecoded signals are inputted to the main decoding portion 2, at least one of the three FETs 8 in each of 127 decoding circuits 7 except the decoding circuit 7 corresponding to a word line 6 indicated by the address signal is turned on so that the decoded signal output is switched from high level to low level. At this time, the low level is inputted from the decoding circuit 7 corresponding to an address of the word line 6 into the AND gate 13 of the buffer circuit 11. Thus, the output of the AND gate 13 remains low level and the word line 6 is not activated so that it is kept not selected.

On the other hand, all the FETs 8 of the decoding circuit 7 corresponding to the word line 6 indicated by the address signals remain off so that a precharged high level potential is held at the output terminal 10 of the decoding circuit 7. Because this high level potential is supplied to one input of the AND gate 13 of the buffer circuit 11 and the decoded signal output of the decoding circuit 7 different by one bit is always switched to low level, the high level of the inverted signal is supplied to the other input of the AND gate 13, so that the output of the AND gate 13 is switched from low level to high level. As a result, the word line 6 is activated from low level to high level so that the non-selective condition is changed to the selective condition.

In such an address decoding circuit, the clock signal for activating the word line 6 after decoding is not required. The activation of the word line 6 is determined at the timing when the decoding circuit 7 having an address different by one bit detects its non-selection. As regards the adjacent two word lines 6, because the output signal of the inverting gate 12 has a delay corresponding to a single gate of the inverting gate 12 relative to the decoded signal output of the decoding circuit 7 corresponding to the address signal different by one bit, the output timing of the inverting gate 12 is never too early when the word line 6 becomes non-selected. Accordingly the timing of the word line 6 is compensated.

Therefore, unlike a conventional example, it is not necessary to adjust and input the activation clock signal of the word line into the decoded signal output timing and the timing margin of the clock signal is not required. As a result, the word line selection timing is optimized. A time taken from an input of the address signals up to selection of the word line, that is, decoding operation time can be reduced as compared to the conventional example. Further, there never occurs a glitch thereby preventing an error of the operation.

The main decoding portion 2 adopts a precharge type circuit structure so that the decoded signal output of the decoding circuit 7 is preliminarily set in selective condition so as to detect non-selections of the decoded signals. Thus, the output transition direction of the decoding circuit 7 becomes constant, so that acceleration of the output of the decoded signals is facilitated and acceleration thereof by adjustment of transistor size ratio between the FETs 8 and 9 of the decoding circuit is effective.

Figure 5:
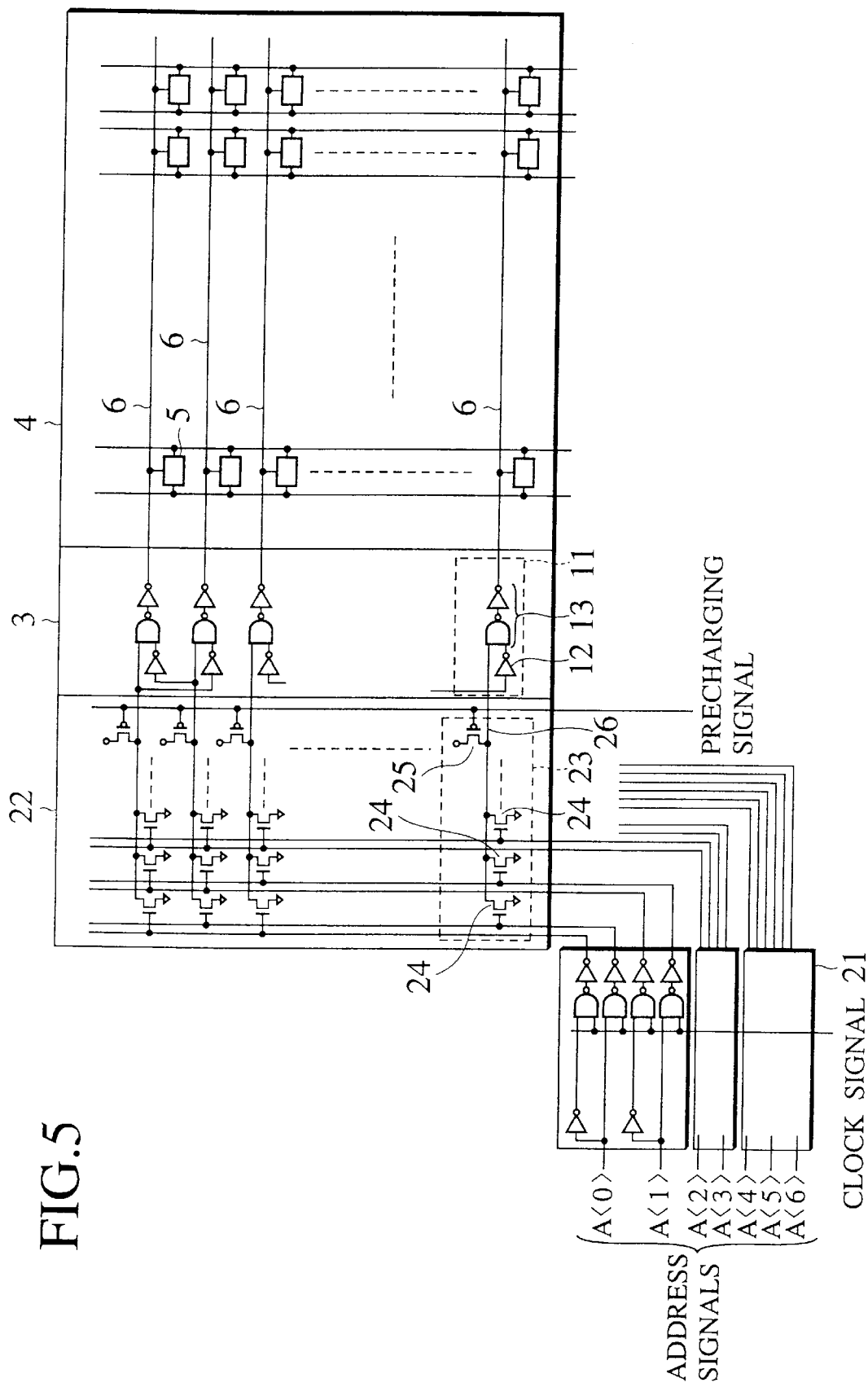
FIG. 5 is a diagram showing a structure of an address decoding circuit according to another embodiment of the present invention.
Figure 6:
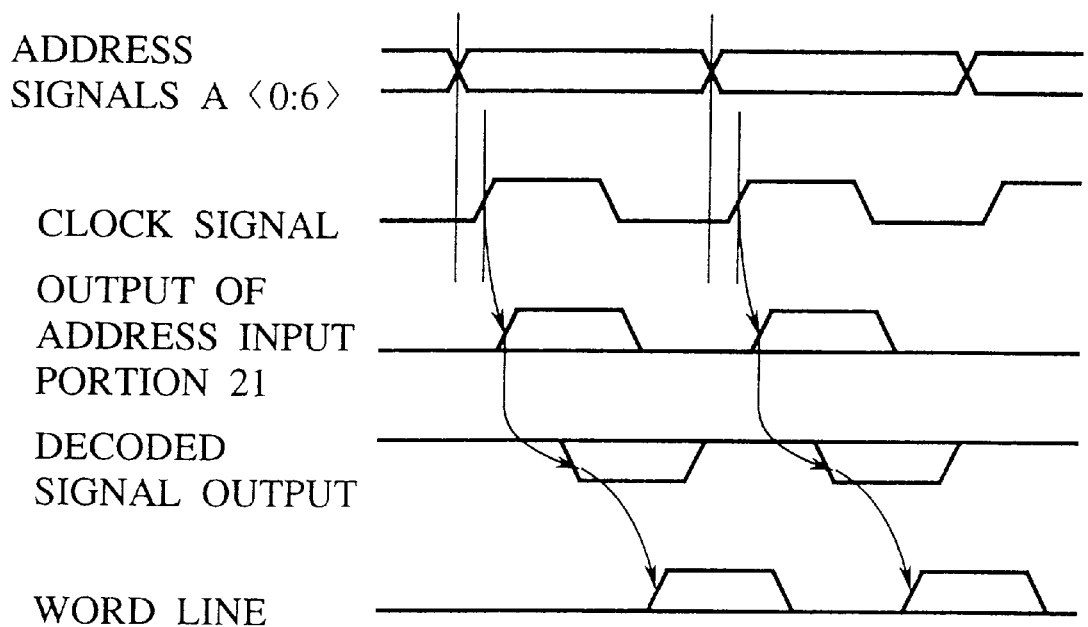
FIG. 6 is a diagram showing an operating waveform of the circuit shown in FIG. 5.

FIG. 5 is a diagram showing a structure of an address decoding circuit according to another embodiment of the present invention, and FIG. 6 is an operational waveform diagram of the circuit shown in FIG. 5. In FIG. 5, the same reference numeral as in FIG. 4 indicate the same function, and therefore a description thereof is omitted.

Referring to FIG. 5, the address decoding circuit of the present embodiment comprises an address input portion 21 for inputting address signals, a decoding portion 22 for decoding the address input applied by the address input portion 21 and a word buffer portion 3 which is the same as the word buffer portion 3 shown in FIG. 4.

An address input portion 21 generates a pair of complementary signals (address signal, inverted address signal) of each address signal and obtains a logical product between the generated address signal and a clock signal so as to generate an address signal synchronous to the clock signal. Each of the output signals of the address input portion 21 is low level at its initial state, and then when the clock signal is inputted, two clock-synchronous address signals complimentary each other are generated with respect to an address signal.

The decoding portion 22 includes 128 decoding circuits 23 corresponding to word lines 6 respectively, the decoding circuit 23 containing N-type MOSFETs 24 of the same number as bit width of the address signal (7 bits in this embodiment) and a P-type MOSFET 25 for precharging. The source terminals of the FETs 24 are commonly grounded and the drain terminals thereof are commonly connected to an output terminal 26. Each of the clock-synchronous address signals from an address input portion 21 is respectively inputted to each gate terminal depending on address of the word line 6 thereby forming a wired OR logic with respect to the output terminal 26. The source terminal of the PET 25 is connected to a power supply level and the drain terminal is connected to the output terminal 26. By a precharging signal applied to the gate terminal, the output terminal 26 of the decoding portion 22 is precharged.

With this structure, when the FET 25 of the decoding portion 22 is turned on by the precharging signal and also all the address signals outputted from the address input portion by the clock signal are set in low level, all the FETs 24 of the decoding portion 22 are turned off so that the decoded signal outputs are fixed to high level. A decoded signal output from a decoding circuit 23 having an address different from the address of a word line 6 by one bit is inverted by the inverting gate 12 and the inverted signal is inputted into the AND gate 13 composing the word line buffer portion 3. Due to the input of this low level inverted signal, the word line 6 is not activated so that it becomes non-selective.

Next, when the FET 25 is turned off by the precharging signal and the address signals are inputted into the decoding portion 22, at least one of the seven FETs 24 in each of the 127 decoding circuits 23 excluding the decoding circuit 23 of the word line 6 indicated by that address signal is turned on, so that the decoded signal output is switched from high level to low level. As a result, the low level signal is inputted into the AND gate 13 of the word line buffer portion 3 from the decoding circuit 23 corresponding to the address signal of that word line 6, so that the output of the AND gate 13 remains low level and the word line 6 is not activated and kept non-selective.

On the other hand, any one of the FETs 24 of the decoding circuit 23 of the word line 6 indicated by the address signal is not turned on, so that an potential (high level) at the time of precharge is kept on the output terminal 26. Thus, this high level potential is inputted to one input terminal of the AND gate 13 of the word line buffer portion 3 and further the decoded signal output of the decoding circuit 23 different by one bit is always switched to low level. And then the high level of that inverted signal is inputted to the other input terminal of the AND gate 13 so that the output of the AND gate 13 is switched from low level to high level, and the word line 6 is activated from low level to high level and becomes into selective condition.

As shown in FIG. 6, like the previously mentioned embodiment, this embodiment does not need a clock signal for activating the word line 6 after decoding and it is not necessary to consider a timing margin for activation of the word line 6 because the activation of the word line 6 is automatically determined at the timing when the decoding circuit 23 having an address different by a bit detects non-selective condition. Further, because the decoding portion 22 is composed of a precharging circuit, only the non-selective procedure of the word line 6 has to be accelerated like the previously mentioned embodiment and therefore the acceleration system can be achieved easily. Further, because the decoding circuit 22 is composed of a wired OR circuit, multi-input gate can be formed as compared to a structure in which decoding is carried out by transistors connected in series, so that it is possible to carry out decoding with a single stage without a predecode, thereby making it possible to further accelerate the decoding operation.

In the above-mentioned respective embodiments, the transition of the data line for obtaining a result of decoding can be formed with a precharge type circuit in which the decoding can be accelerated easily. Further, the clock signal does not have to be inputted into the word line buffer portion 3, so that it is not necessary to consider the timing margin. Because the activation timing of the word line 6 is generated by the decoding portion, this circuit also acts as a timing compensation circuit. Further, because the decoding portion can be formed with the wired OR circuit, a multi-input gate can be formed so that the number of gate stages of the decoding circuit can be reduced. As a result, the address decoding can be accelerated and memory access time can be reduced.

In the above-mentioned embodiments, the address decoded signal corresponding to a signal indicating the non-selection of the word line 6, to be inputted to the inverting gate 12 of each buffer circuit 11 of the word line buffer portion 3 is an address decoded signal different by one bit from of the decoded signal to be supplied to the other input of the AND gate 13 in which this signal is inputted. However, it is permissible to use other address decoded signal indicating the non-selection as well as the address decoded signal different by one bit, and therefore it is possible to use the decoded signal of the decoding circuit 7, 23 detecting the non-selection latest when the output terminal 10, 26 of the decoding circuit 7, 23 is switched from high level to low level by one FET 8, 24 turned on. However, if the address signal different by one bit is used as described in the above embodiments, the wire for inputting a decoded signal of an adjacent decoding circuit 7, 23 into the inverting gate 12 of the word line buffer portion 3 is shortened so that the wiring layout can be achieved easily and further such wiring can be done in a small area.

As described above, according to the present invention, because a structure for activating a signal for selecting the word line by receiving such a decoding result that the word line is made non-selective is applied, a synchronous signal for determining a timing of outputting the decoding result becomes unnecessary. As a result, the output timing of the decoding result can be optimized so that the decoding time can be reduced and further an error can be prevented.

It should be understood that many modifications and adaptations of the invention will become apparent to those skilled in the art and it is intended to encompass such obvious modifications and changes in the scope of the claims appended hereto.

What is claimed is:

1. An address decoding circuit of synchronous type for decoding address signals of n-bit so as to select one of $2^n$ output selective signals and make the selected one in selective condition, the address decoding circuit comprising:

a decoding circuit for decoding the address signals of n-bit so as to select one of $2^n$ decoded signals preliminarily set to selective condition and keeping its selective condition and then switching the other decoded signals except the selected decoded signal from the selective condition to non-selective condition; and a buffer circuit for detecting by receiving the $2^n$ decoded signals from the decoding circuit that the other decoded signals different from the decoded signal kept in the selective condition have been switched from the selective condition to the non-selective condition and then selecting an output selective signal corresponding to the decoded signal in the selective condition, out of the $2^n$ output selective signals corresponding to the $2^n$ decoded signals, and making the output selective signal in the selective condition.

2. An address decoding circuit according to claim 1 wherein the decoding circuit comprises:

a predecoding portion for dividing the address signals of n-bit into a predetermined number to decode the divided address signals and outputting its decoding result synchronously with a clock signal as intermediate decoded signals; and a main decoding portion having FETs for precharging $2^n$ output lines for outputting the $2^n$ decoded signals in the selective condition and FETs for discharging output lines corresponding to the intermediate decoded signals supplied from the predecoding portion, and the buffer potion comprises:

$2^n$ inverting circuits for inverting an output line of the $2^n$ output lines except a corresponding output line thereof; and $2^n$ gate buffers for obtaining logical product between a corresponding output line signal and an output signal of a corresponding inverting circuit thereof of the $2^n$ inverting circuits to generating the $2^n$ output selective signals.

3. An address decoding circuit according to claim 2 wherein each of the $2^n$ inverting circuits inputs an output line whose address is different by one bit from an address of the corresponding output line as the output line except the corresponding output line so as to invert the inputted output line.

4. An address decoding circuit according to claim 2 wherein each of the $2^n$ inverting circuits inputs an output line converted to non-selective condition latest of the $2^n$ output lines except the corresponding output line as the output line except the corresponding output line so as to invert the inputted output line.

5. An address decoding circuit according to claim 1 wherein the decoding circuit comprises:

an address input portion for receiving the address signals and outputting the address signals and inverted address signals generated by inverting the address signals synchronously with a clock signal; and a decoding portion having FETs for precharging $2^n$ output lines for outputting the $2^n$ decoded signals in the selective condition and FETs for discharging output lines corresponding to the address signals and the inverted address signals supplied from the address input portion, and the buffer potion comprises:

$2^n$ inverting circuits for inverting an output line of the $2^n$ output lines except a corresponding output line thereof; and $2^n$ gate buffers for obtaining logical product between a corresponding output line signal and an output signal of a corresponding inverting circuit thereof of the $2^n$ inverting circuits to generating the $2^n$ output selective signals.

6. An address decoding circuit according to claim 5 wherein each of the $2^n$ inverting circuits inputs an output line whose address is different by one bit from an address of the corresponding output line as the output line except the corresponding output line so as to invert the inputted output line.

7. An address decoding circuit according to claim 5 wherein each of the $2^n$ inverting circuits inputs an output line converted to non-selective condition latest of the $2^n$ output lines except the corresponding output line as the output line except the corresponding output line so as to invert the inputted output line.

8. An address decoding circuit according to claim 1, further comprising:

a predecoding portion that receives a clock signal and wherein the predecoding portion clocks in the address signals of n-bit in accordance with the clock signal; and a main decoding portion that is provided between the predecoding portion and the buffer circuit, the main decoding portion receiving a precharging signal for precharging $2^n$ output lines that are provided to the buffer circuit, wherein the $2^n$ decoded signals from the main decoding circuit respectively received by the buffer circuit on the $2^n$ output lines are provided directly in a non-clocked manner to the buffer circuit.

* * * * *